United States Patent
Ong et al.

(10) Patent No.: US 6,992,167 B2
(45) Date of Patent: *Jan. 31, 2006

(54) POLYTHIOPHENES AND DEVICES THEREOF

(75) Inventors: Beng S. Ong, Mississauga (CA); Lu Jiang, Oakville (CA); Yiliang Wu, Mississauga (CA); Dasarao K. Murti, Mississauga (CA)

(73) Assignee: Xerox Corporation, Stamford, CT (US)

( * ) Notice: Subject to any disclaimer, the term of this patent is extended or adjusted under 35 U.S.C. 154(b) by 78 days.

This patent is subject to a terminal disclaimer.

(21) Appl. No.: 10/874,929

(22) Filed: Jun. 23, 2004

(65) Prior Publication Data

US 2004/0236070 A1    Nov. 25, 2004

Related U.S. Application Data

(62) Division of application No. 10/042,359, filed on Jan. 11, 2002, now Pat. No. 6,777,529.

(51) Int. Cl.
*C08G 75/00* (2006.01)
(52) U.S. Cl. ..................... 528/373; 528/377
(58) Field of Classification Search ............... 528/373, 528/377
See application file for complete search history.

(56) References Cited

U.S. PATENT DOCUMENTS

| | | | |
|---|---|---|---|
| 5,619,357 A | 4/1997 | Angelopoulos et al. | 349/110 |
| 5,777,070 A | 7/1998 | Inbasekaran et al. | 528/394 |
| 5,969,376 A | 10/1999 | Bao | 257/40 |
| 6,107,117 A | 8/2000 | Bao et al. | 438/99 |
| 6,150,191 A | 11/2000 | Bao | 438/99 |
| 6,777,529 B2 * | 8/2004 | Ong et al. | 528/373 |

OTHER PUBLICATIONS

D.J. Gundlach et al., "Pentacene organic thin film transistors—molecular ordering and mobility", IEEE Electron Device Lett., vol. 18, p. 87 (1997).

F. Garnier et al., "Molecular engineering of organic semiconductors: Design of self-assembly properties in conjugated thiophene oligomers", Amer. Chem. Soc., vol. 115, p. 8716 (1993).

Z. Bao et al., "Soluble and processable regioregular poly(3-hexylthiophene) for field-effect thin film transistor application with high mobility", *Appl. Phys. Lett.* vol. 69, p. 4108 (1996).

* cited by examiner

*Primary Examiner*—Duc Truong
(74) *Attorney, Agent, or Firm*—E. O. Palazzo

(57) ABSTRACT

Polythiophenes of the formula

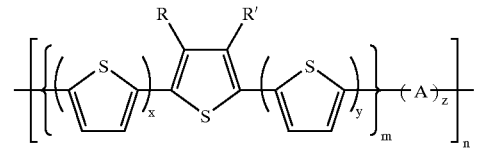

wherein R and R' are side chains; A is a divalent linkage; x and y represent the number of unsubstituted thienylene units; z represents the number of groups, and wherein the sum of x and y represents the number of groups; m represents the number of segments; and n represents the degree of polymerization.

13 Claims, 2 Drawing Sheets

POLYTHIOPHENES AND DEVICES THEREOF

CROSS-REFERENCE TO RELATED APPLICATIONS

This application is a DIV of Ser. No. 10/042,359 filed Jan. 11, 2002 now U.S. Pat. No. 6,777,529.

COPENDING APPLICATIONS

Illustrated in copending applications and patents U.S. Ser. No. 10/042,342, now U.S. Publication No. 20030160234; U.S. Pat. No. 6,770,094, U.S. Pat. No. 6,621,099, U.S. Ser. No. 10/042,357, now U.S. Publication No. 20030171531, U.S. Pat. No. 6,872,801, the disclosures of which are totally Incorporated herein by reference, all titled "Polythiophenes and Devices Thereof" and all filed Jan. 11, 2002, are polythiophenes and devices thereof. The appropriate components, processes thereof and uses thereof illustrated in these copending applications and related patents may be selected for the present invention in embodiments thereof.

BACKGROUND

The present invention is generally directed to organic microelectronic devices, and more specifically, in embodiments to the use of a class of polythiophenes as active materials in thin film transistors. The polythiophenes selected can be comprised of repeating thienylene units in which only certain thienylenes possess side chains, and which thienylene units are arranged in a regioregular manner on the polythiophene backbone.

The polythiophenes are in embodiments substantially stable enabling their device fabrication to be accomplished at ambient conditions, and wherein the devices provide higher current on/off ratios, and are operationally more stable as their performance usually does not degrade as rapidly as those of known regioregular polythiophenes such as regioregular poly(3-alkylthiophene-2,5-diyl). More specifically, the polythiophenes of the present invention contain in embodiments repeating segments of 3,4-disubstituted-2,5-thienylene units flanked by unsubstituted 2,5-thienylene units and an optional divalent linkage. The side chains assist in inducing and facilitating molecular self-organization of the polythiophenes during film fabrication, while the unsubstituted thienylene units and the optional divalent linkage, which have some degree of rotational freedom, can disrupt the extended $\pi$-conjugation along the polythiophene chain, thus suppressing its propensity towards oxidative doping.

Semiconductive polymers like certain polythiophenes, which are useful as active semiconductor materials in thin film transistors (TFTs), have been reported. A number of these polymers have reasonably good solubility in organic solvents and are thus able to be fabricated as semiconductor channel layers in TFTs by solution processes, such as spin coating, solution casting, dip coating, screen printing, stamp printing, jet printing, and the like. Their ability to be fabricated via common solution processes would render their manufacturing simpler and cost effective as compared to the costly conventional photolithographic processes typical of the silicon-based devices such as hydrogenated amorphous silicon TFTs. Moreover, desired are transistors fabricated with polymer materials, such as polythiophenes, referred to as polymer TFTs, include excellent mechanical durability and structural flexibility, which may be highly desirable for fabricating flexible TFTs on plastic substrates. Flexible TFTs would enable the design of electronic devices which usually require structural flexibility and mechanical durability characteristics. The use of plastic substrates, together with an organic or polymer transistor component, can transform the traditionally rigid silicon TFT into a mechanically more durable and structurally flexible polymer TFT design. The latter is of particular appeal to large-area devices, such as large-area image sensors, electronic paper and other display media as flexible TFTs, could enable a compact and structurally flexible design. Also, the selection of polymer TFTs for integrated circuit logic elements for low-end microelectronics, such as smart cards and radio frequency identification (RFID) tags, and memory/storage devices may also greatly enhance their mechanical durability, thus their useful life span. Nonetheless, many of the semiconductor polythiophenes are not stable when exposed to air as they become oxidatively doped by ambient oxygen resulting in increased conductivity. The result is larger off-current and thus lower current on/off ratio for the devices fabricated from these materials. Accordingly, with many of these materials, rigorous precautions have to be undertaken during materials processing and device fabrication to exclude environmental oxygen to avoid oxidative doping. These precautionary measures add to the cost of manufacturing, therefore, offsetting the appeal of certain polymer TFTs as an economical alternative to amorphous silicon technology, particularly for large-area devices. These and other disadvantages are avoided or minimized in embodiments of the present invention.

REFERENCES

A number of organic semiconductor materials has been described for use in field-effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997), to oligomers such as sexithiophenes or their variants, see for example reference F. Garnier et al., "Molecular engineering of organic semiconductors: Design of self-assembly properties in conjugated thiophene oligomers", *Amer. Chem. Soc.*, Vol. 115, p. 8716 (1993), polythiophenes of which poly(3-alkylthiophene), see for example reference Z. Bao et al., "Soluble and processable regioregular poly(3 -hexylthiophene) for field-effect thin film transistor application with high mobility", *Appl. Phys. Lett.* Vol. 69, p4108 (1996), have been most studied. Although organic material-based TFTs generally provide lower performance characteristics than their conventional silicon counterparts, such as silicon crystal or polysilicon TFTs, they are nonetheless sufficiently useful for applications in areas where high mobility is not required. These include large-area devices, such as image sensors, active matrix liquid crystal displays and low-end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for transportability. However, most small molecule or oligomer-based devices rely on difficult vacuum deposition techniques for fabrication. Vacuum deposition is selected because the small molecular materials are either insoluble or their solution processing by spin coating, solution casting, stamp printing do not generally provide uniform thin films.

In addition, vacuum deposition may also have the difficulty of achieving consistent thin film quality for large area format. Polymer TFTs, such as those fabricated from regioregular polythiophenes of, for example, regioregular poly (3-alkylthiophene-2,5-diyl) by solution processes, while offering reasonably high mobility, suffer from their propensity towards oxidative doping in air. For practical low-cost TFT design, it is therefore essential to have a semiconductor material that is both stable and solution processable, and where its performance is not adversely affected by ambient oxygen, for example, regioregular polythiophenes such as poly(3-alkylthiophene-2,5-diyl) are very sensitive to air. The TFTs fabricated from these materials in ambient conditions generally exhibit very large off-current, very low current on/off ratios, and their performance characteristics degrade rapidly.

References that may be of interest include U.S. Pat. Nos. 6,150,191; 6,107,117; 5,969,376; 5,619,357, and 5,777,070.

FIGURES

Illustrated in FIGS. 1 to 4 are various representative embodiments of the present invention and wherein polythiophenes are selected as the channel materials in thin film transistor (TFT) configurations.

SUMMARY

It is a feature of the present invention to provide semiconductor polymers, such as polythiophenes, which are useful for microelectronic device applications like thin film transistor devices.

It is another feature of the present invention to provide polythiophenes with a band gap of from about 1.5 eV to about 3 eV as determined from the absorption spectra of thin films thereof, and which polythiophenes are suitable for use as thin film transistor semiconductor channel layer materials.

In yet a further feature of the present invention there are provided polythiophenes which are useful as microelectronic components, and which polythiophenes have reasonable solubility of, for example, at least about 0.1 percent by weight in common organic solvents, such as methylene chloride, tetrahydrofuran, toluene, xylene, mesitylene, chlorobenzene, and the like, and thus can be economically fabricated by solution processes, such as spin coating, screen printing, stamp printing, dip coating, solution casting, jet printing and the like.

Another feature of the present invention resides in providing electronic devices, such as thin film transistors with a polythiophene channel layer, and which layer has a conductivity of from $10^{-6}$ to about $10^{-9}$ S/cm (Siemens/centimeter).

Also, in yet another feature of the present invention there are provided polythiophenes and devices thereof, and which devices exhibit enhanced resistance to the adverse effects of oxygen, that is, these devices exhibit relatively high current on/off ratios, and their performance does not usually degrade as rapidly or minimal degradation results as those fabricated from regioregular polythiophenes such as regioregular poly (3-alkylthiophene-2,5-diyl).

Additionally, in a further feature of the present invention there is provided a class of polythiophenes with unique structural features which are conducive to molecular self-alignment under appropriate processing conditions, and which structural features also enhance the stability of device performance. Proper molecular alignment can result in higher molecular structural order in thin films, permitting efficient charge carrier transport, and thus higher electrical performance.

Aspects of the present invention include polythiophenes of the formula wherein R and R' are side chains; A is a divalent linkage; x and y represent the number of unsubstituted thienylene units or segments; z is 0 or 1, and wherein the sum of x and y is greater than zero; m represents the number of segments; and n represents the degree of polymerization; a polythiophene wherein the side chains are independently selected from the group consisting of alkyl, alkyl derivatives of alkoxyalkyl; siloxy-substituted alkyl, perhaloalkyl and polyether; A is an alkylene or arylene optionally of phenylene, biphenylene, phenanthrenylene, dihydrophenanthrenylene, fluorenylene, oligoarylene, methylene, polymethylene, dialkylmethylene, dioxyalkylene, dioxyarylene, or oligoethylene oxide; and n is from about 5 to about 5,000; a polythiophene wherein the number average molecular weight ($M_n$) of the polythiophenes is from about 2,000 to about 100,000 and the weight average molecular weight ($M_w$) is from about 4,000 to about 500,000, both as measured by gel permeation chromatography using polystyrene standards; a polythiophene wherein the polythiophene is (1), (2), (3), (4), (5), or (6)

-continued

(4)

(5)

(6)

a polythiophene represented by (1), (2), or (3)

(1)

(2)

(3)

a polythiophene represented by

(1)

(2)

(3)

(4)

(5)

(6)

-continued (7)

(8)

(9)

(10)

(11)

(12)

(13)

(14)

polythiophene (I) wherein x and y are integers of from zero to about 10, z is zero or 1, and m is from 1 to about 5; a polythiophene wherein x and y are integers of from about 1 to about 7, z is zero or 1, m is from 1 to about 5, and n is from about 5 to about 3,000; polythiophene (I) wherein the polyhaloalkyl is a perfluoroalkyl; polythiophene (I) wherein $M_w$ is from about 5,000 to about 100,000, $M_n$ is from about 4,000 to about 50,000; the side chain is alkyl with from about 3 to about 25 carbon atoms, or alkoxy with from 3 to about 25 carbon atoms, and A is an arylene; a polythiophene wherein the R and R' contain from about 3 to about 20 carbon atoms; polythiophene (I) wherein R and R' are independently selected from the group consisting of alkyl, alkyl derivatives of alkoxyalkyl; siloxy-substituted alkyl, perhaloalkyl of perfluoroalkyl and polyether; A is selected from the group consisting of arylene of phenylene, biphenylene, phenanthrenylene, dihydrophenanthrenylene, fluorenylene, dioxyalkylene, and dioxyarylene; polythiophene

(I) wherein the R and R' are independently selected from the group consisting of propyl, butyl, pentyl, hexyl, heptyl, octyl, nonyl, decyl, undecyl, dodecyl, tridecyl, tetradecyl, pentadecyl, and isomers thereof; polythiophene (I) wherein R and R' are selected from the group consisting of hexyl, heptyl, octyl, nonyl, decyl, undecyl, dodecyl, tridecyl, tetradecyl, and pentadecyl; A is selected from the group consisting of phenylene, biphenylene, and fluorenylene; x and y are each independently a number of from zero to about 10; and m is a number of from 1 to about 5; polythiophene (I) wherein n is from about 7 to about 5,000; the number average molecular weight ($M_n$) of the polythiophene is from about 2,000 to about 100,000; weight average molecular weight ($M_w$) is from about 4,000 to about 500,000, both as measured by gel permeation chromatography using polystyrene standards; a polythiophene wherein A is phenylene, biphenylene, or fluorenylene; a polythiophene wherein n is from about 5 to about 5,000; a polythiophene wherein n is from about 10 to about 1,000; a polythiophene wherein the polythiophene is selected from the group consisting of polythiophenes of Formulas (1) through (8)

polythiophene (I) wherein x, y and m are from 1 to 3, and z is 0 or 1; polythiophene (I) wherein x, y and m are 1, and z is 0 or 1; polythiophene (I) wherein $M_n$ is from about 4,000 to about 50,000, and $M_w$ is from about 5,000 to about 100,000; a polythiophene wherein the sum of x and y is from about 1 to about 10; a polythiophene wherein the sum of x and y is from about 1 to about 3; a polythiophene wherein n is from about 10 to about 4,000, and m is from about 1 to about 5; and polythiophenes encompassed by wherein R and R' are side chains independently selected, for example, from the group consisting of alkyl, alkyl derivatives, such as alkoxyalkyl; siloxy-substituted alkyl, perhaloalkyl, such as perfluoroalkyl, polyether, such as oligoethylene oxide, polysiloxy, and the like; A is a divalent linkage selected, for example, from the group consisting of arylene, such as phenylene, biphenylene, phenanthrenylene, dihydrophenanthrenylene, fluorenylene, oligoarylene, methylene, polymethylene, dialkylmethylene, dioxyalkylene, dioxyarylene, oligoethylene oxide, and the like; x and y are integers independently selected from 0 to about 10, z is either 0 or 1 with the provision that the sum of x and y is greater than zero; m is an integer of from 1 to about 5; and n is the degree of polymerization, and can generally be from about 5 to over 5,000, and more specifically, from about 10 to about 1,000. The number average molecular weight ($M_n$) of the polythiophenes can be, for example, from about 2,000 to about 100,000, and more specifically, from about 4,000 to about 50,000, and the weight average molecular weight ($M_w$) thereof can be from about 4,000 to about 500,000, and more specifically, from about 5,000 to about 100,000 both as measured by gel permeation chromatography using polystyrene standards.

Examples of the side chains R and R' include alkyl with, for example, from about 1 to about 25, and more specifically, from about 4 to about 12 carbon atoms, such as butyl, pentyl, hexyl, heptyl, octyl, nonyl, decyl, undecyl, dodecyl, isomeric forms thereof, and the like; alkoxyalkyl with from 1 to about 25 carbon atoms, such as for example methoxypropyl, methoxybutyl, methoxyhexyl, methoxyhexyl, methoxyheptyl, and the like, polyether chains, such as polyethylene oxide, perhaloalkyl, such as perfluoroalkyl of, for example, nonafluorohexyl, nonafluoroheptyl, pentadecafluorooctyl, tridecafluorononyl, and the like, and a polysiloxy chain, such as trialkylsiloxyalkyl, and the like.

More specifically, examples of thiophenes are (1)

(2)

(3)

(4)

(5)

(6)

(7)

(8)

(9)

-continued

(10)

(11)

(12)

(13)

(14)

The polythiophenes, reference Formula (I), are comprised of regioregular segments of 3,4-disubstituted-2,5-thienylene units, unsubstituted 2,5-thienylene units, and an optional divalent linkage. The regioregularity of the side chains in polythiophene (I), reference Formulas (1) through (14), is believed to be capable of inducing molecular self-alignment during thin film fabrication under appropriate processing conditions enabling highly organized microstructures in thin films. Higher order microstructures in a semiconductor channel layer of a thin film transistor enhance transistor performance. It is believed that these polythiophenes, when fabricated as thin films of about 10 nanometers to about 500 nanometers from their solutions in appropriate solvent systems, form strong intermolecular π-π stacks which are conducive to efficient charge carrier transport. The unsubstituted thienylene moieties in (I), by virtue of possessing some degree of rotational freedom, help to disrupt the extended intramolecular π-conjugation of (I) to an extent that is sufficient to suppress its propensity towards oxidative doping. Accordingly, the polythiophenes are stable in ambient conditions, and the devices fabricated from these polythiophenes are functionally more stable than regioregular polythiophenes such as regioregular poly(3-alkylthiophene-2,5-diyl). When unprotected, the devices fabricated from Formula (I) polythiophenes in embodiments thereof are generally stable for weeks or even months, such as for example about 3 weeks to about 12 weeks rather than days, such as for example about less than 5 days for the devices of regioregular poly(3-alkylthiophene-2,5-diyl) when exposed to ambient oxygen; also the devices fabricated from the polythiophenes provide higher current on/off ratios, and their performance does not change as rapidly as those of poly(3-alkylthiophene-2,5-diyl) when no rigorous procedural precautions are taken to exclude ambient oxygen during material preparation, device fabrication, and evaluation. The materials stability against oxidative doping is particularly useful for low-cost device manufacturing; since the materials are more stable, they usually do not have to be handled in a strictly inert atmosphere and the processes of preparation are, therefore, simpler and more cost effective, and which processes are amenable to simple large-scale production processes.

The polythiophenes in embodiments are soluble in common coating solvents; for example, they possess a solubility of at least about 0.1 percent by weight, and more specifically, from about 0.5 percent to about 15 percent by weight in such solvents as methylene chloride, 1,2-dichloroethane, tetrahydrofuran, toluene, xylene, mesitylene, chlorobenzene, and the like. Moreover, the polythiophenes when fabricated as semiconductor channel layers in thin film transistor devices provide a stable conductivity of, for example, from about $10^{-9}$ S/cm to about $10^{-6}$ S/cm, and more specifically, from about $10^{-8}$ S/cm to about $10^{-7}$ S/cm as determined by conventional four-probe conductivity measurement.

The polythiophenes of the present invention can be prepared by polymerization of a properly constructed monomer, such as for example a trithiophene monomer, 2,5-bis(2-thienyl)-3,4-di-R-thiophene (IIa), or 2,5-bis(5-bromo-2-thienyl)-3,4-di-R-thiophene (IIb) for the preparation of illustrative polythiophenes (Ia) and (Ib) according to Scheme 1. As the monomers ((IIa) and (IIb) carry two side chains on their respectively central thienylene units, their polymerizations, therefore, lead to polythiophenes (Ia) and (Ib) whose side chains are regioregularly positioned on their respective polythiophene backbones. Unlike the preparation of regioregular polythiophenes, such as poly(3-alkylthiophene-2,5-diyl) which require regioregular coupling reaction, the polythiophenes of the present invention can be prepared by general polymerization techniques without regioregularity complications. Specifically, (Ia) can be prepared from monomer (IIa) by $FeCl_3$-mediated oxidative coupling polymerization or from monomer (IIb) by treating with Reike zinc, followed by addition of $Ni(dppe)Cl_2$ catalyst. Polythiophene (IIb), on the other hand, can be readily obtained from (IIb) by Suzuki coupling reaction with appropriate arylene diboronate.

mmolar equivalents of (IIb) in anhydrous tetrahydrofuran is added dropwise over a period of 20 minutes to 40 minutes to a well-stirred suspension of 11 mmolar equivalent of freshly prepared Reike Zn in anhydrous tetrahydrofuran, and the resulting mixture is then permitted to react for about 30 minutes to about 2 hours at room temperature, about 22° C. to about 25° C. Subsequently, a suspension of about 0.1 mmolar equivalent of $Ni(dppe)Cl_2$ in anhydrous tetrahydrofuran is slowly added over a period of about 10 minutes to about 20 minutes, and the mixture is then heated at about 40° C. to about 65° C. for 2 to 5 hours. The reaction mixture is then poured into dilute hydrochloric acid solution in methanol with vigorous stirring to precipitate the polymer product. The latter is redissolved in hot tetrahydrofuran and then reprecipitated from dilute ammonia solution in methanol.

More specifically, polythiophene (Ib) can be obtained by the Suzuki coupling reaction of monomer (IIb) with an appropriate arylene-diboronate. A mixture of equal molar equivalents of (IIa) and arylene-diboronate in toluene, about 2 to 6 molar percent of tetrakis(triphenylphosphine)-palladum, about 2 to about 4 molar equivalents of an inorganic base, such as sodium carbonate, in the form of a 1 M to 2 M Scheme 1

Zn*: Reike zinc
$Ni(dppe)Cl_2$: [1,2-Bis(diphenylphosphinoethane)]dichloronickel(II)
$(Ph_3P)_4Pd$: Tetrakis(triphenylphosphine)palladium Specifically, the polymerization of (IIa) can be accomplished by adding a solution of 1 molar equivalent of (IIa) in a chlorinated solvent, such as chloroform, to a suspension of about 1 to about 5 molar equivalent of anhydrous $FeCl_3$ in chloroform under a blanket of dried air. The resultant mixture is allowed to react at a temperature of about 25° C. to about 50° C. under a blanket of dried air or with a slow stream of dried air bubbling through the reaction mixture for a period of about 30 minutes to about 48 hours. After the reaction, the polymer product is isolated by washing the reaction mixture with water or dilute aqueous hydrochloric acid solution, stirring with dilute aqueous ammonium solution, followed by washing with water, and then precipitated from methanol or acetone. For the Reike zinc method, 10 aqueous solution, and about 1 to 5 mole percent of a phase transfer catalyst, such as tetrabutylamomonium chloride or tricaprylylmethylammonium chloride, is heated at about 90° C. under an inert atmosphere for 48 hours. After polymerization, polythiophene product (Ib) is isolated by repeated precipitation from methonol.

FIGURES

Illustrated in FIGS. 1 to 4 are various representative embodiments of the present invention and wherein the polythiophenes are selected as the channel materials in thin film transistor (TFT) configurations.

Figure 1:
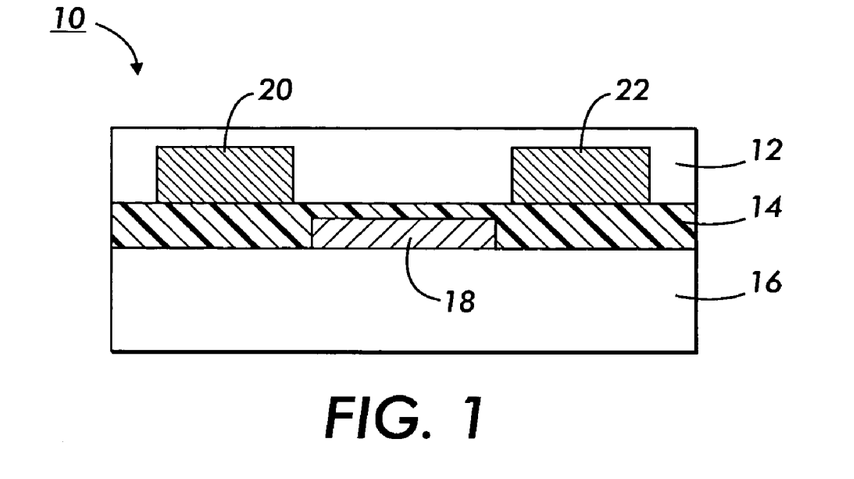

In FIG. 1 there is schematically illustrated a thin film transistor configuration 10 comprised of a substrate 16, in contact therewith a metal contact 18 (gate electrode) and a layer of an insulating dielectric layer 14 contained thereon or on top of which two metal contacts, 20 and 22 (source and drain electrodes) are deposited. Over and between the metal contacts 20 and 22 is the polythiophene semiconductor layer 12.

Figure 2:
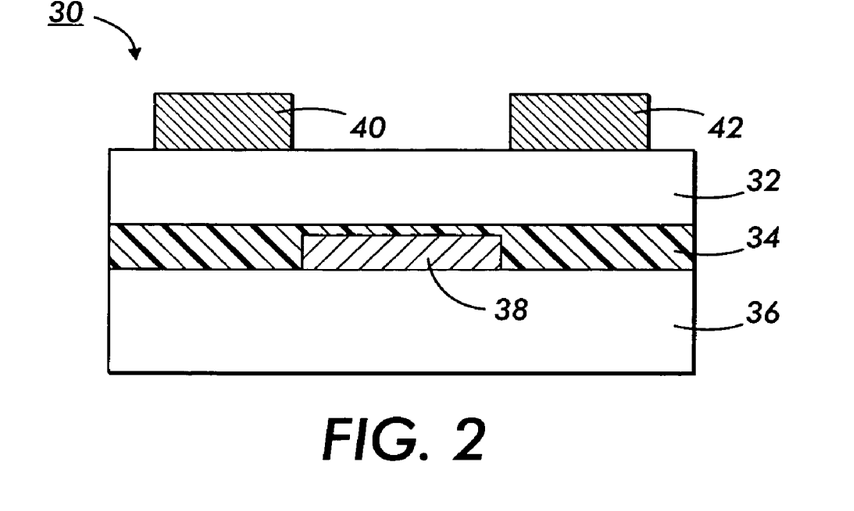

FIG. 2 schematically illustrates another thin film transistor configuration 30 comprised of a substrate 36, a gate electrode 38, a source electrode 40, and a drain electrode 42, an insulating dielectric layer 34, and the polythiophene semiconductor layer 32.

Figure 3:
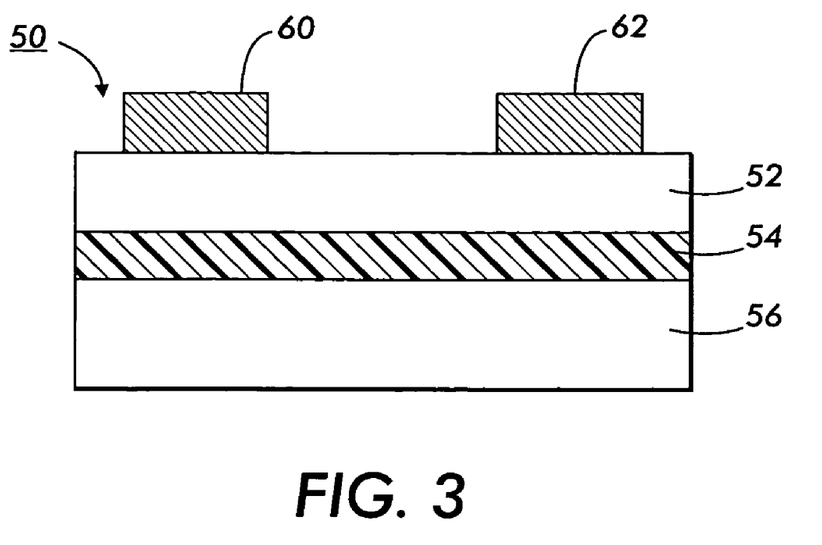

FIG. 3 schematically illustrates a thin film transistor configuration 50 comprised of a heavily n-doped silicon wafer 56 which acts as a gate electrode, a thermally grown silicon oxide dielectric layer 54, and the polythiophene semiconductor layer 52, on top of which are deposited a source electrode 60 and a drain electrode 62.

Figure 4:
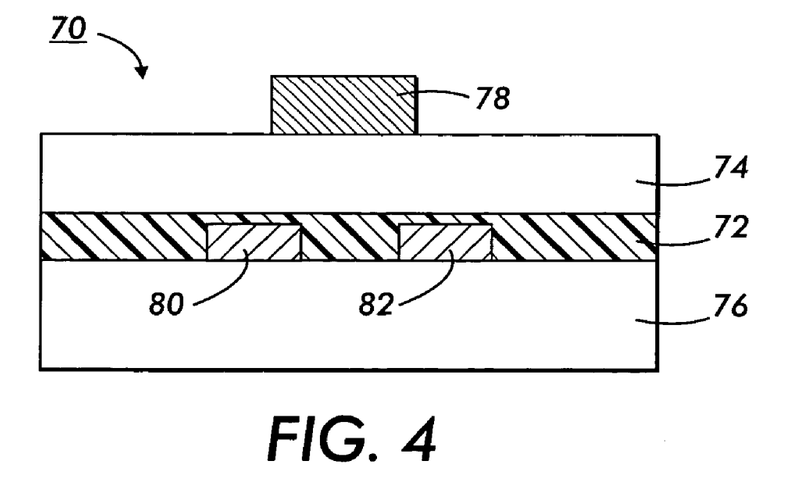

FIG. 4 schematically illustrates an additional thin film transistor configuration 70 comprised of substrate 76, a gate electrode 78, a source electrode 80, a drain electrode 82, a polythiophene semiconductor layer 72, and an insulating dielectric layer 74.

In some embodiments of the present invention, an optional protecting layer may be incorporated on top of each of the transistor configurations of FIGS. 1, 2, 3 and 4. For the thin film transistor configuration of FIG. 4, the insulating dielectric layer 74 may also be able to function as a protecting layer.

The substrate layer may generally be a silicon material inclusive of various appropriate forms of silicon, glass plate, plastic film or sheet, or the like depending on the intended applications. For structurally flexible devices, plastic substrate, such as for example polyester, polycarbonate, polyimide sheets, and the like, may be preferred. The thickness of the substrate may be from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which separates the gate electrode from the source and drain electrodes and in contact with the semiconductor layer, can generally be an inorganic material film, an organic polymer film, or an organic-inorganic composite film. The thickness of the dielectric layer is, for example, from about 10 nanometers to about 1 micrometer, with the more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; while illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of at least about 3, so that a suitable dielectric thickness of about 300 nanometers would provide a desirable capacitance, for example, about of $10^{-9}$ to about $10^{-7}$ F/cm$^2$.

Situated between and in contact with the dielectric layer and the source/drain electrodes is the active semiconductor layer comprised of the polythiophenes illustrated herein, and wherein the thickness of this layer is generally about 10 nanometers to about 1 micrometer with the thickness being about 40 to about 100 nanometers. This layer can generally be fabricated by solution processes such as spin coating, casting, screen, stamp, or jet printing of a solution of the polythiophenes of the present invention.

The gate electrode can be a thin metal film, a conducting polymer film, a conducting film made from conducting ink or paste, or the substrate itself (for example heavily doped silicon). Examples of gate electrode materials include but are not restricted to aluminum, gold, chromium, indium tin oxide, conducting polymers, such as polystyrene sulfonate-doped poly(3,4-ethylenedioxythiophene) (PSS-/PEDOT), conducting ink/paste comprised of carbon black/graphite or colloidal silver dispersion in polymer binders, such as ELECTRODAG available from Acheson Colloids Company and silver filled electrically conductive thermoplastic ink available from Noelle Industries, and the like. The gate layer can be prepared by vacuum evaporation, sputtering of metals or conductive metal oxides, coating from conducting polymer solutions or conducting inks by spin coating, casting or printing. The thickness of the gate electrode layer is in the range of about 10 nanometers to about 10 micrometers, and the preferred thickness is in the range of about 10 to about 200 nanometers for metal films and in the range of about 1 to about 10 micrometers for polymer conductors.

The source and drain electrode layer can be fabricated from materials which provide a low-resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT device structure consists of a semiconductor channel with a width W and length L. The semiconductor channel width may be from about 10 micrometers to about 5 millimeters, with the preferred channel width being about 100 micrometers to about 1 millimeter. The semiconductor channel length may be from about 1 micrometer to about 1 millimeter with the more specific channel length being from about 5 micrometers to about 100 micrometers.

The source electrode is grounded and a bias voltage of generally about 0 volt to about −80 volts is applied to the drain electrode to collect the charge carriers transported across the semiconductor channel when a voltage of generally about +10 volts to about −80 volts is applied to the gate electrode.

The following Examples are provided.

General Procedure a) Device Fabrication:

There were selected a bottom-contact and a top-contact thin film transistor structures as schematically described by FIG. 1 and FIG. 3, respectively, as the primary test device configurations. The bottom-contact test device was comprised of a series of photolithographically pre-patterned transistor's dielectric layers and electrodes with defined channel widths and lengths on a glass substrate. The gate electrode on the glass substrate was comprised of chromium of about 80 nanometers in thickness. The gate dielectric was a 300 nanometers thick silicon nitride having a capacitance of about 22 nF/cm$^2$ (nanofarads/square centimeter). On top of or coated on the gate dielectric layer there was provided by vacuum deposition the source and drain contacts comprised of gold of about 100 nanometers in thickness. The test polythiophene semiconductor layer of about 30 nanometers to 100 nanometers in thickness was then deposited by spin coating under ambient conditions without taking any precautions to exclude it from exposure to ambient oxygen, moisture, or light. The solution used in fabricating the semiconductor layer was comprised of 1 percent by weight of the polythiophene in an appropriate solvent, and was filtered through a 0.45 $\mu$m filter before use. The spin coating was accomplished at a spinning speed of 1,000 rpm for about 35 seconds. The resulting coated device was dried in vacuo at 80° C. for 20 hours, and was then ready for evaluation.

The top-contact test device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$. The silicon wafer was first cleaned with methanol, air dried, and then immersed in a 0.01 M solution of 1,1,1,3,3,3-hexamethyldisilazane in dichloromethane for 30 minutes at room temperature, 22° C. to 25° C. Subsequently, the wafer was washed with dichloromethane and dried. The semiconductor polythiophene layer of about 30 nanometers to about 100 nanometers in thickness was then deposited on top of the silicon oxide dielectric layer by spin coating and dried in vacuo at 80° C. for 20 hours. No precautions were taken to exclude the materials from exposure to ambient oxygen, moisture, or light during device fabrication. Subsequently, the gold source and drain electrodes were deposited on top of the semiconductor polythiophene layer by vacuum deposition through a shadow mask with various channel lengths and widths, thus creating a series of transistors of various dimensions. For consistency, the devices after fabrication were kept in a dry atmosphere of about 30 percent relative humidity in the dark before and after evaluation.

b) TFT Device Characterization:

The evaluation of field-effect transistor performance was accomplished in a black box at ambient conditions using a Keithley 4200 SCS semiconductor characterization system. The carrier mobility, $\mu$, was calculated from the data in the saturated regime (gate voltage, $V_G$<source-drain voltage, $V_{SD}$) accordingly to equation (1)

$$I_{SD} = C_i \mu (W/2L)(V_G - V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

A property of value for the thin film transistor is its current on/off ratio, which is the ratio of the saturation source-drain current when the gate voltage $V_G$ is equal to or greater than the drain voltage $V_D$ to the source-drain current when the gate voltage $V_G$ is zero.

COMPARATIVE EXAMPLE

A bottom-contact device and a top-contact device with configurations as described by FIGS. 1 and 3, respectively, were fabricated by essentially repeating the above except that the known regioregular polythiophene, poly(3-hexythiophene-2,5-diyl) was selected. This material was purchased from Aldrich Chemical and was purified by three successive precipitations of its solution in chlorobenzene from methanol.

The semiconductor polythiophene layers were laid down on the devices in ambient conditions by spin coating a 1 percent by weight solution of regioregular poly(3-hexythiophene-2,5-diyl) in chlorobenzene according to the procedures as described herein before. The devices were dried in vacuo at 80° C. for 20 hours before evaluation. The following summarizes the average properties from at least five transistors for each device:

(1) Bottom-contact device (W=1,000 $\mu$m; L=10 $\mu$m)
  Mobility: 1 to 2.3×10$^{-3}$ cm$^2$/V.sec
  Initial current on-off ratio: 0.8 to 1×10$^3$
  Current on/off ratio after 5 days: 5 to 10
(2) Top-contact device (W=5,000 $\mu$m; L=60 $\mu$m)
  Mobility: 1 to 1.2×10$^{-2}$ cm$^2$/V.sec
  Initial on-off ratio: 1.5 to 2.1×10$^3$
  On-off ratio after 5 days: 5 to 10

The observed low initial current on/off ratios are an indication of the propensity of poly(3-hexythiophene-2,5-diyl) towards oxidative doping, that is the instability of poly(3-hexythiophene-2,5-diyl) in the presence of ambient oxygen. The significant reductions in the current on/off ratios over just a five-day period further confirm the extreme functional instability of poly(3-hexythiophene-2,5-diyl) in ambient conditions.

EXAMPLE (a) Synthesis of Poly[2,5-bis(2-thienyl)-3,4-dioctylthiophene] (2)

i) Monomer Synthesis: The monomer 2,5-bis(5-bromo-2-thienyl)-3,4-dioctylthiophene for the preparation of polythiophene (2) was synthesized as follows:

3,4-Dioctylthiophene: 2 M octylmagnesium bromide (100 milliliters, 0.2 mol) in anhydrous ethyl ether was added to a well-stirred mixture of dichloro[1,3-bis(diphenylphosphino)-propane]nickel(II) (0.2 gram) and 3,4-dibromothiophene (20.16 grams, 0.0833 mol) in 200 milliliters of anhydrous ethyl ether in a 500 milliliter round bottom flask cooled with an ice bath under an inert atmosphere. The nickel complex reacted immediately with the Grignard reagent and the resulting reaction mixture was allowed to warm up to room temperature. An exothermic reaction started within 30 minutes and the ethyl ether began to reflux gently. After stirring for another 2 hours at room temperature, the reaction mixture was refluxed for 6 hours, then cooled in an ice bath, and hydrolyzed with aqueous 2N hydrochloric acid. The organic layer was separated and washed successively with water, brine, and again with water, dried over anhydrous sodium sulfate, and filtered. After evaporation of the solvent, the residue was distilled under reduced pressure through Kugelrohr apparatus to provide 21.3 grams of 3,4-dioctylthiophene as a colorless liquid.

$^1$H NMR (CDCl$_3$): $\delta$ 6.89 (s, 2H), 2.50 (t, J=7.0 Hz, 4H), 1.64–1.58 (m, 4), 1.40–1.28 (m, 20H), 0.89 (t, J=6.5 Hz, 6H); $^{13}$C NMR (CDCl$_3$) $\delta$ 142.1, 119.8, 31.9, 29.6 (2C), 29.5, 29.3, 28.8, 22.7, 14.1.

2,5-Dibromo-3,4-dioctylthiophene: N-bromosuccinimide (4.6 grams, 25.7 mmol) was added to a well-stirred solution of 3,4-dioctylthiophene (3.6 grams, 11.7 mmol) in a mixture of 30 milliliters of dichloromethane and 10 milliliters of acetic acid in a 100 milliliter round-bottomed flask. The reaction was monitored by thin layer chromatography and was complete in about 35 minutes. The mixture was diluted with 160 milliliters of dichloromethane and filtered to remove succinimide. The filtrate was washed with aqueous 2N sodium hydroxide solution, and then twice with water (2×100 milliliters). After drying with anhydrous sodium sulfate and removal of the solvent, 5.4 grams of 2,5-dibromo-3,4-dioctylthiophene as a light yellow liquid.

$^1$H NMR (CDCl$_3$): δ 2.50 (t, J=7.0 Hz, 4H), 1.52–1.28 (m, 24H), 0.89 (t, J=6.5 Hz, 6H).

2,5-Bis(2-thienyl)-3,4-dioctylthiophene: In a dry box under an inert atmosphere, Pd(PPh$_3$)$_2$Cl$_2$ (0.15 gram, 0.2 mmol) was added to a mixture of 2,5-dibromo-3,4-dioctylthiophene (4.2 grams, 9.0 mmol) and 2-(tributylstannyl)thiophene (7.4 grams, 19.8 mmol) in anhydrous tetrahydrofuran (50 milliliters) in a 250 milliliter round-bottomed flask. The mixture was then refluxed for 12 hours and the solvent was removed by evaporation. The crude product thus obtained was purified by flash chromatography on silica gel using hexane as eluent to give 3.1 grams of 2,5-bis(2-thienyl)-3,4-dioctylthiophene.

$^1$H NMR (CDCl$_3$): δ 7.31 (dd, J=3.2, 0.5 Hz, 2H), 7.13 (dd, J=2.2, 0.5 Hz, 2H), 7.06 (dd, J=2.2, 4.5 Hz, 2H), 2.68 (dd, J=7.6, 7.6 Hz, 4H), 1.59–1.53 (m, 4H), 1.42–1.27 (m, 20H), 0.91 (t, J=6.5 Hz, 6H).

2,5-Bis(5-bromo-2-thienyl)-3,4-dioctylthiophene: N-bromo succinimide (2.8 grams, 15.7 mmol) was added to a well-stirred solution of 2,5-bis(2-thienyl)-3,4-dioctylthiophene (3.6 grams, 7.6 mmol) of N,N-dimethylformamide (30 milliliters) in a 100 milliliter round-bottomed flask cooled with an ice-bath. After addition, the mixture was allowed to warm up to room temperature slowly. The reaction was monitored by thin layer chromotography and was stopped after 3 hours of reaction. The resulting mixture was diluted with hexanes (170 milliliters) and washed with three times with 100 milliliters of water. The organic layer was separated, dried with anhydrous sodium sulfate, and vacuum evaporated to provide the crude product, which was purified by flash chromatography on silica gel using hexane as eluent to give 2.5 grams of 2,5-bis(5-bromo-2-thienyl)-3,4-dioctylthiophene.

$^1$H NMR (CDCl$_3$): δ 7.06 (d, J=3.5 Hz, 2H), 6.86 (d, J=3.5 Hz, 2H), 2.62 (dd, J=7.3, 7.3 Hz, 4H), 1.55–1.49 (m, 4H), 1.41–1.28 (m, 20H), 0.89 (t, J=6.5 Hz, 6H); $^{13}$C NMR (CDCl$_3$) δ 140.6, 137.4, 130.2, 129.3, 126.2, 112.0, 31.9, 30.8, 29.8, 29.2 (2C), 28.1, 22.7, 14.2.

Poly[2,5-bis(2-thienyl)-3,4-dioctylthiophene] (2): A well stirred suspension of freshly prepared Reike Zn (0.28 gram, 4.29 mmol) in anhydrous tetrahydrofuran (20 milliliters) under an inert atmosphere was added dropwise to a solution of 2,5-bis(5-bromo-2-thienyl)-3,4-dioctylthiophene (2.46 grams, 3.9 mmol) in anhydrous tetrahydrofuran (10 milliliters), and the mixture was permitted to react for 45 minutes at room temperature. Subsequently, a suspension of Ni(dppe)Cl$_2$ (0.021 gram, 0.04 mmol) in anhydrous tetrahydrofuran (35 milliliters) was carefully added. The reaction mixture was heated at 60° C. for 3 hours and then poured into 2N hydrochloric acid solution in methanol. The precipitated polythiophene product was filtered, redissolved in 70 milliliters of hot tetrahydrofuran, and precipitated from 2N ammonia solution in methanol. This procedure was repeated twice to remove the acid and oligomers. After drying in vacuo at room temperature, 1.6 grams of poly[2,5-bis(2-thienyl)-3,4-dioctylthiophene] (2), M$_w$, 41,900, M$_n$, 11,800 K, Tm, 180° C. resulted.

$^1$H NMR (CDCl$_3$): δ 7.30, 7.13, 7.05, 2.73, 1.59, 1.45, 1.29, 0.89; $^{13}$C NMR (CDCl$_3$) δ 140.4, 136.7, 135.1, 129.8, 126.4, 123.9, 31.9, 30.7, 29.9, 29.3, 28.3, 22.7, 14.2.

Two test devices, one bottom-contact and one top-contact in configuration as schematically represented in FIGS. 1 and 3, respectively, were fabricated using the above polythiophene in accordance with the fabrication procedures described above. The devices were dried in vacuo at 80° C. for 20 hours before evaluation. The following summarizes the average properties from at least five transistors for each device

(1) Bottom-contact device (W=1,000 μm; L=10 μm)
Mobility: $3.4 \times 10^{-4}$ to $1.3 \times 10^{-3}$ cm$^2$/V.sec
Initial current on/off ratio: 0.8 to $1.3 \times 10^4$
Current on/off ratio after 5 days: 5.0 to $7.0 \times 10^3$ (2) Top-contact device (W=5,000 μm; L=60 μm)
Mobility: 1.3 to $3.1 \times 10^{-3}$ cm$^2$/V.sec
Initial on-off ratio: 1.5 to $2.6 \times 10^5$
On-off ratio after 5 days: $1.1–2.0 \times 10^5$
On-off ratio after 30 days: $8.0–9.5 \times 10^4$ The stability of the polythiophene semiconductor layer in embodiments of the present invention was demonstrated by the large initial current on/off rations and the slow reductions in current on/off ratio over time.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:
1. Polythiophenes of the formula wherein R and R' are side chains; A is a divalent linkage; x and y represent the number of unsubstituted thienylene units; z represents the number of groups, and wherein the sum of x and y represents the number of groups; m represents the number of segments; and n represents the degree of polymerization.

2. A polythiophene in accordance with claim 1 wherein the number average molecular weight (M$_n$) of the polythiophenes is from about 2,000 to about 100,000 and the weight average molecular weight (M$_w$) is from about 4,000 to about 500,000, both as measured by gel permeation chromatography using polystyrene standards; z is 1 and the sum of x+y is less than about 2.

3. A polythiophene in accordance with claim 1 wherein x is a number of from zero to about 10, z is 1, and m is from 1 to about 5.

4. A polythiophene in accordance with claim 1 wherein x is a number of from about 1 to about 7, z is zero or 1, m is from 1 to about 5, and n is from about 5 to about 3,000.

5. A polythiophene in accordance with claim 1 wherein said R and R' contain from about 3 to about 10 carbon atoms.

6. A polythiophene in accordance with claim 1 wherein R and R' are selected from the group consisting of hexyl, heptyl, octyl, nonyl, decyl, undecyl, dodecyl, tridecyl, tetradecyl, and pentadecyl; A is selected from the group consisting of phenylene, biphenylene, and fluorenylene; x and y are each independently a number of from zero to about 10; and m is a number of from 1 to about 5.

7. A polythiophene in accordance with claim 1 wherein x, y and m are from 1 to 3, and z is 0 or 1.

8. A polythiophene in accordance with claim 1 wherein x, y and m are 1, and z is 0 or 1.

9. A polythiophene in accordance with claim 1 wherein x, y are from 0 to 3, m is from 1 to 3, and z is 0 or 1.

10. A polythiophene in accordance with claim 1 wherein x, y and m are 1, and z is 0.

11. A polythiophene in accordance with claim 1 wherein the sum of x and y is from about 1 to about 10.

12. A polythiophene in accordance with claim 1 wherein the sum of x and y is from about 1 to about 5.

13. A polythiophene in accordance with claim 1 wherein n is from about 10 to about 1,000, and m is from about 1 to about 3.

* * * * *

UNITED STATES PATENT AND TRADEMARK OFFICE
CERTIFICATE OF CORRECTION

PATENT NO.        : 6,992,167 B2
APPLICATION NO.   : 10/874929
DATED             : January 31, 2006
INVENTOR(S)       : Ong et al.

Page 1 of 1

It is certified that error appears in the above-identified patent and that said Letters Patent is hereby corrected as shown below:

In column 1, line 23, the following should be added before the title "BACKGROUND":

--STATEMENT REGARDING FEDERALLY SPONSORED RESEARCH OR DEVELOPMENT
  This invention was made with United States Government support under Cooperative Agreement No. 70NANBOH3033 awarded by the National Institute of Standards and Technology (NIST). The United States Government has certain rights in this invention.--

Signed and Sealed this

Twentieth Day of February, 2007

JON W. DUDAS
*Director of the United States Patent and Trademark Office*

UNITED STATES PATENT AND TRADEMARK OFFICE
CERTIFICATE OF CORRECTION

Page 1 of 1

PATENT NO. : 6,992,167 B2
APPLICATION NO. : 10/874929
DATED : January 31, 2006
INVENTOR(S) : Ong et al.

It is certified that error appears in the above-identified patent and that said Letters Patent is hereby corrected as shown below:

In the Specification

In column 1, line 23, the following should be added before the title "BACKGROUND":

--STATEMENT REGARDING FEDERALLY SPONSORED RESEARCH OR DEVELOPMENT
This invention was made with United States Government support under Cooperative Agreement No. 70NANB0H3033 awarded by the National Institute of Standards and Technology (NIST). The United States Government has certain rights in this invention.--

This certificate supersedes the Certificate of Correction issued February 20, 2007.

Signed and Sealed this
Seventeenth Day of September, 2013

Teresa Stanek Rea
*Deputy Director of the United States Patent and Trademark Office*